(12) United States Patent
Amos et al.

(10) Patent No.: US 6,429,101 B1
(45) Date of Patent: Aug. 6, 2002

(54) METHOD OF FORMING THERMALLY STABLE POLYCRYSTAL TO SINGLE CRYSTAL ELECTRICAL CONTACT STRUCTURE

(75) Inventors: Ricky S. Amos, Apex, NC (US); Arne W. Ballantine, South Burlington; Gregory Bazan, Winooski, both of VT (US); Bomy A. Chen, Stormville, NY (US); Douglas D. Coolbaugh, Essex Junction, VT (US); Ramachandra Divakaruni, Middletown, NY (US); Heidi L. Greer, Essex Junction, VT (US); Herbert L. Ho, New Windsor, NY (US); Joseph F. Kudlacik, Milton, VT (US); Bernard P. Leroy, Suresnes (FR); Paul C. Parries, Wappingers Falls; Gary L. Patton, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/240,753

(22) Filed: Jan. 29, 1999

(51) Int. Cl.[7] .................. H01L 21/20; H01L 21/425; H01L 21/3205
(52) U.S. Cl. ............... 438/488; 438/489; 438/491; 438/530; 438/592; 438/593; 438/775
(58) Field of Search .................. 438/775, 778, 438/532, 488–491, 514, 522, 530, 201, 585, 592, 593; 427/86, 89, 94

(56) References Cited

U.S. PATENT DOCUMENTS

| | | | |
|---|---|---|---|
| 4,113,515 A | | 9/1978 | Kooi et al. |
| 4,394,406 A | * | 7/1983 | Gardiner et al. ............ 427/86 |
| 4,433,469 A | * | 2/1984 | Goodman .................. 29/571 |
| 4,562,640 A | | 1/1986 | Widmann et al. |
| 4,755,487 A | | 7/1988 | Scovell et al. |
| 4,882,294 A | | 11/1989 | Christenson |
| 5,091,760 A | | 2/1992 | Maeda et al. |
| 5,111,266 A | | 5/1992 | Furumura et al. |
| 5,130,885 A | | 7/1992 | Fazan et al. |
| 5,151,387 A | | 9/1992 | Brady et al. |
| 5,180,688 A | | 1/1993 | Bryant et al. |
| 5,194,397 A | | 3/1993 | Cook et al. |
| 5,268,324 A | | 12/1993 | Aitken et al. |
| 5,476,799 A | | 12/1995 | Sakamoto et al. |
| 5,489,542 A | | 2/1996 | Iwai et al. |
| 5,646,073 A | | 7/1997 | Grider et al. |
| 6,068,928 A | * | 5/2000 | Schrems et al. ............ 428/446 |
| 6,080,611 A | * | 6/2000 | Miura et al. ............... 438/201 |

FOREIGN PATENT DOCUMENTS

| | | |
|---|---|---|
| EP | 0196155 A3 | 10/1986 |
| JP | 8213492 | 8/1996 |

* cited by examiner

*Primary Examiner*—Ha Tran Nguyen
(74) *Attorney, Agent, or Firm*—Connolly Bove Lodge Hutz, LLP; William D. Sabo

(57) ABSTRACT

A method for forming a thermally stable ohmic contact structure that includes a region of monocrystalline semiconductor and a region of polycrystalline semiconductor. At least one region of dielectric material is formed between at least a portion of the region of monocrystalline semiconductor and the region of polycrystalline semiconductor, thereby controlling grain growth of the polycrystalline semiconductor.

57 Claims, 2 Drawing Sheets

METHOD OF FORMING THERMALLY STABLE POLYCRYSTAL TO SINGLE CRYSTAL ELECTRICAL CONTACT STRUCTURE

FIELD OF THE INVENTION

The present invention relates to a process for producing a thermally stable non-monocrystalline semiconductor to monocrystalline electrical contact structure. The invention also relates to devices including such a thermally stable monocrystalline to non-monocrystalline electrical contact structure.

BACKGROUND OF THE INVENTION

Many semiconductor devices include a region of monocrystalline semiconductor adjacent a region of non-monocrystalline semiconductor. Non-monocrystalline semiconductor can include amorphous semiconductor as well as polycrystalline semiconductor. Often, after non-monocrystalline semiconductor is deposited on monocrystalline semiconductor, the structure that includes the monocrystalline semiconductor and non-monocrystalline semiconductor may still be subjected to further processing steps. Often, the further processing steps cause changes in the monocrystalline semiconductor, non-monocrystalline semiconductor as well as dopants and other materials in the semiconductors.

For example, further processing steps may subject the monocrystalline semiconductor and non-monocrystalline semiconductor to heat. Heat may cause the grain or crystal size of the non-monocrystalline semiconductor to change. Heat may also cause dopants in the monocrystalline semiconductor and non-monocrystalline semiconductor to be redistributed. Another effect of heat may be to shift the boundary between the monocrystalline semiconductor and the non-monocrystalline semiconductor.

The boundary shift may occur as because not only may non-monocrystalline semiconductor material undergo grain size change, but it may also regrow epitaxially into and/or onto monocrystalline semiconductor. Large grains of polycrystalline semiconductor material may grow preferentially and consume material in smaller grains. This process of crystal or grain size growth may be driven by free energy of the crystal boundaries. Polycrystalline semiconductor may have lower free energy when it includes larger grain sizes.

The larger grain sizes also result in a smaller area in the grain boundaries. If non-monocrystalline semiconductor, particularly polycrystalline semiconductor is in contact with monocrystalline semiconductor, the monocrystalline semiconductor may, in effect, act as a very large grain compared to the monocrystalline or non-monocrystalline semiconductor. As a result, during high temperature treatments, material from polycrystalline semiconductor, in particular, may undergo grain growth by realigning epitaxially into or onto the monocrystalline semiconductor matrix.

Such grain regrowth in polycrystalline silicon may begin at temperatures of about 900° C. The temperature may be slightly lower if the polycrystalline silicon is n-type or p-type doped. If the polycrystalline silicon is totally amorphized, then epitaxial regrowth may take place at temperatures in the range of about 500° C.

Changes in the semiconductor structure can lead to degradation of electrical contact characteristics and/or create defects that can propagate into the monocrystalline semiconductor material. Often, the structures that include monocrystalline semiconductor and an adjacent non-monocrystalline semiconductor are utilized as semiconductor contacts. One example of such a contact is a buried strap.

Such a buried strap may be utilized in, among other applications, 0.25 μm and smaller MINT DRAM memory cells. One memory cell utilizing such a buried strap and including a monocrystalline/non-monocrystalline interface experiences variable retention time problems. These problems may be caused by defects that propagate from epitaxially regrown regions of polycrystalline semiconductor into monocrystalline semiconductor.

In the "buried strap" structure in 0.25 μm and below trench DRAM's mentioned above, an interface exists between non-monocrystalline silicon and monocrystalline silicon. The buried strap is an abutted polycrystalline silicon to monocrystalline silicon connection fabricated to provide electrical continuity between a monocrystalline silicon diffusion layer and polycrystalline silicon filling inside of the storage trench of the device. Subsequent to depositing this connection there are several high temperature processing steps at temperatures in excess of about 900° C. during which it is possible for epitaxial regrowth to occur.

DRAM cells are very sensitive to the presence of crystal defects in the junctions that make up the storage node. For example, it has been observed that the 0.25 μm DRAM suffered from a tendency to form dislocations more than previous DRAM generations. It has been demonstrated that dislocations may be generated due to epitaxial growth of polycrystalline silicon in the trench onto the monocrystalline silicon of the substrate. It has also been observed that monocrystalline silicon material formed during epitaxial regrowth may contain many crystal defects. Some of these defects may be free to propagate into the monocrystalline semiconductor substrate region where they can produce undesirable leakage. It also may be possible that the epitaxial regrowth produces a flux of point defects which then coalesce to produce a dislocation under the influence of stress in the single crystal region. In any case, the solution to this problem is to suppress the epitaxial regrowth of the polycrystalline semiconductor into and/or onto monocrystalline semiconductor.

Of course, the buried strap structure discussed above is only one example of a structure that includes an interface between monocrystalline semiconductor and polycrystalline semiconductor where the above discussed problems may manifest themselves.

SUMMARY OF THE INVENTION

To provide a solution to the above-discussed and other problems, aspects of the present invention provide a method for forming a thermally stable ohmic contact structure including a region of monocrystalline semiconductor and a region of polycrystalline semiconductor. At least one region of dielectric material is formed between at least a portion of the region of monocrystalline semiconductor and the region of polycrystalline semiconductor, thereby controlling grain growth of the polycrystalline semiconductor.

Other aspects of the present invention provide a method for forming a thermally stable structure including a region of monocrystalline semiconductor and a region of polycrystalline semiconductor. At least one region of electrically conducting material is provided between at least a portion of the region of monocrystalline semiconductor and the region of polycrystalline semiconductor.

Additional aspects of the present invention provide a method for forming a thermally stable structure including a region of monocrystalline semiconductor and a region of polycrystalline semiconductor. At least one region of polycrystalline semiconductor material with a lattice mismatch with respect to the monocrystalline semiconductor is deposited between at least a portion of the region of monocrystalline semiconductor and the region of polycrystalline semiconductor.

Further aspects of the present invention provide a method for forming a thermally stable structure including a region of monocrystalline semiconductor and a region of polycrystalline semiconductor. The region of polycrystalline semiconductor is deposited on a surface of the region of monocrystalline semiconductor. At least one impurity is introduced into the polycrystalline semiconductor as it is being deposited.

Still further aspects of the present invention provide a method for forming a thermally stable structure including a region of monocrystalline semiconductor and a region of polycrystalline semiconductor. At least one region of amorphous semiconductor material is deposited adjacent the region of monocrystalline semiconductor material. The amorphous semiconductor is then crystallized to form the polycrystalline semiconductor.

Additional aspects of the present invention provide a method for forming a thermally stable structure including a region of monocrystalline semiconductor and a region of polycrystalline semiconductor. This method includes suppressing grain growth of the polycrystalline semiconductor as it is deposited on the monocrystalline semiconductor.

In addition to methods for forming thermally stable structures, the present invention also includes a thermally stable semiconductor device structure that includes a region of monocrystalline semiconductor, a region of non-monocrystalline semiconductor, and an ohmic contact interface region between at least a portion of the monocrystalline semiconductor and a region of non-monocrystalline semiconductor.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

The present invention provides solutions to problems associated with interfaces between regions of monocrystalline semiconductor material and regions of non-monocrystalline semiconductor materials, including polycrystalline semiconductor materials and amorphous semiconductor materials. The present invention solves these problems by providing an interface region at least between at least a portion of the region of monocrystalline semiconductor material and the region of non-monocrystalline semiconductor materials. The region may be in the form of an interface layer. However, utilization of the term "layer" does not necessarily mean that the layers continuous. In fact, typically, the interface layer according to the present invention could be discontinuous. Accordingly, the interface layer of the present invention may be described as one or more monolayers or less. Less than a monolayer could be considered to be a discontinuous layer.

By providing an interface layer or region between a region of monocrystalline semiconductor and a region of non-monocrystalline semiconductor, the present invention helps to prevent problems resulting from exposing the monocrystalline semiconductor and non-monocrystalline semiconductor to subsequent processing steps that include elevated, and especially great elevated, high temperature processing steps. The present invention therefore solves problems associated with changes brought on by exposing structures including monocrystalline semiconductor adjacent non-monocrystalline semiconductor to elevated temperature processing steps.

In order to prevent recrystallization, dislocations and other associated problems discussed above, an interface layer according to the present invention may be provided to disrupt the monocrystalline semiconductor structure at the interface with the amorphous and/or polycrystalline semiconductor. One important function of the interface of the present invention is to mask monocrystalline semiconductor from an adjacent non-monocrystalline semiconductor. This is particularly the case where the non-monocrystalline semiconductor includes an amorphous semiconductor undergoing crystallization. Once the non-monocrystalline semiconductor is no longer subject to high temperature processes, such as once the amorphous layer is crystallized, the integrity of the interface layer of the present invention may no longer be required. For example, as discussed above, the interface layer may eventually dissolve and breakup during high temperature subsequent processing.

Figure 1:
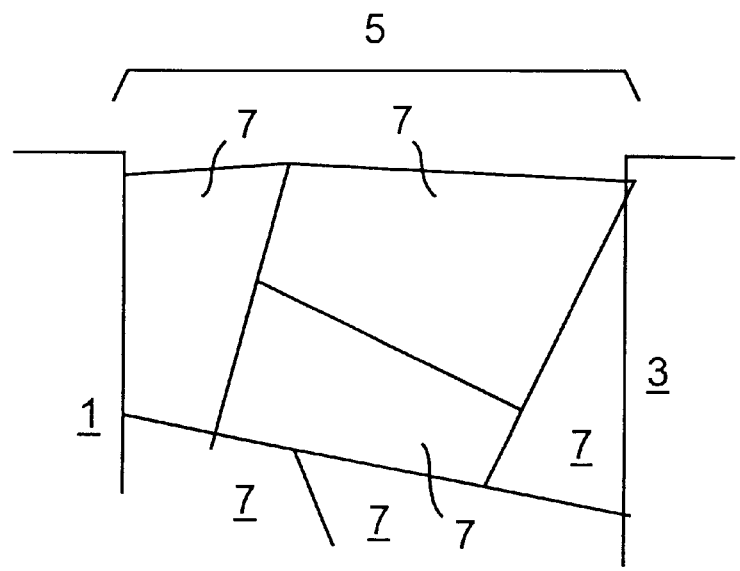
FIG. 1 represents a cross-sectional view of an embodiment of a structure that includes a region of monocrystalline semiconductor abutting a region of non-monocrystalline semiconductor.

FIG. 1 illustrates a structure that includes monocrystalline semiconductor regions 1 and 3. Region 5 between monocrystalline regions 1 and 3 may be polycrystalline. The polycrystalline region 5 includes a plurality of crystals 7.

Figure 2:
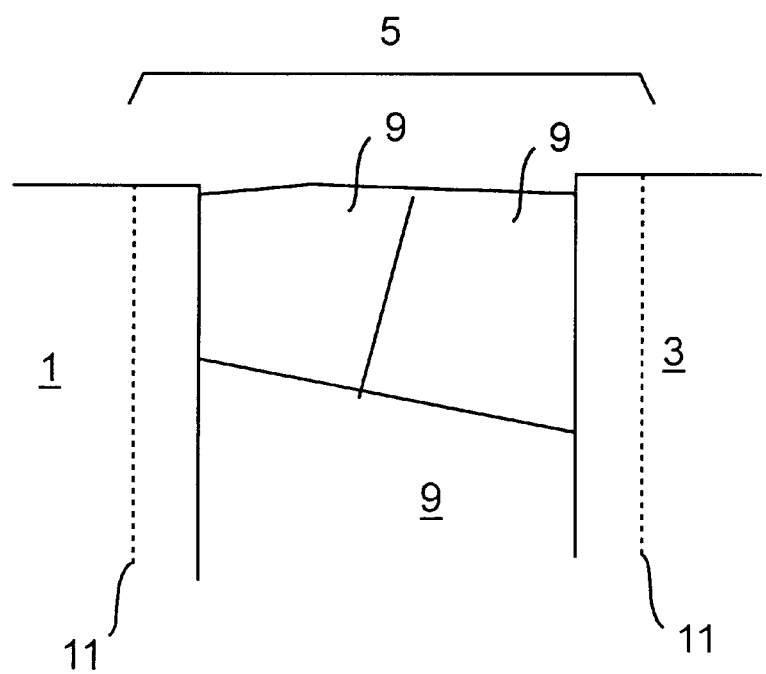
FIG. 2 represents a cross-sectional view of the structure illustrated in FIG. 1 after having undergone changes as a result of further processing steps exposing the device to elevated temperatures.

FIG. 2 illustrates a structure shown in FIG. 1 after undergoing subsequent high temperature processes. As can be seen in FIG. 2, the individual crystals 7 have increased in size to larger crystals 9. Additionally, the boundary between the monocrystalline regions 1 and 3 and the polycrystalline region 5 has shifted as indicated by the dashed lines 11.

Figure 3:
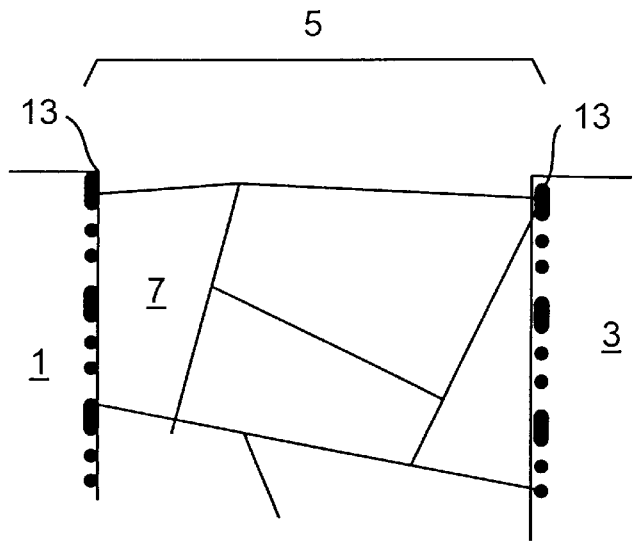
FIG. 3 represents a cross-sectional view of an embodiment of a semiconductor device that includes a region of monocrystalline semiconductor, a region of polycrystalline semiconductor, and an interface layer according to the present invention between the region of monocrystalline semiconductor and the region of polycrystalline semiconductor.
Figure 4:
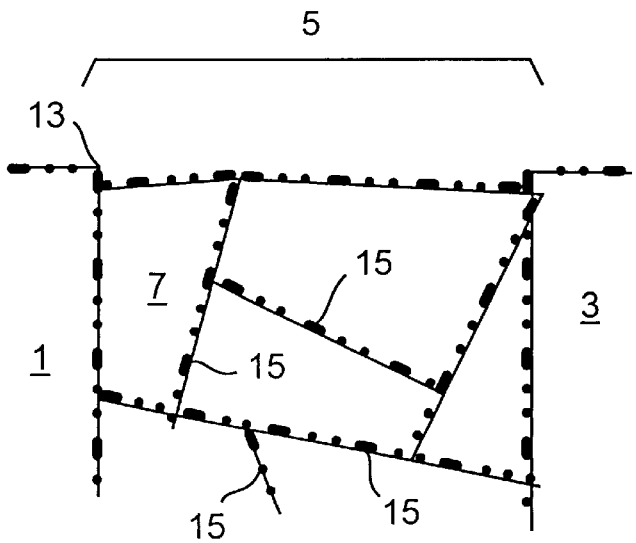
FIG. 4 represents another embodiment of a semiconductor device according to the present invention that includes a region of monocrystalline semiconductor, a region of polycrystalline semiconductor, and a plurality of interface regions between the region of monocrystalline semiconductor and the region of polycrystalline semiconductor as well as between different portions of the region of polycrystalline semiconductor.

As a solution to this problem, as discussed above, the present invention may provide a layer between monocrystalline and non-monocrystalline regions. As shown in FIG. 3, a barrier layer 13 according to the present invention may be provided at the interface between monocrystalline regions 1 and 3 and polycrystalline region 5. As shown in FIG. 4, an interface layer according to the present invention may not only be provided at the region between the monocrystalline and non-monocrystalline semiconductor regions but also between each crystal, or grain, of the polycrystalline region 5, as indicated by interfacial layers 15. Additionally, as illustrated in FIG. 5 the present invention may include interface layers only at certain boundaries within the polycrystalline region as indicated by layers 17.

Figure 5:
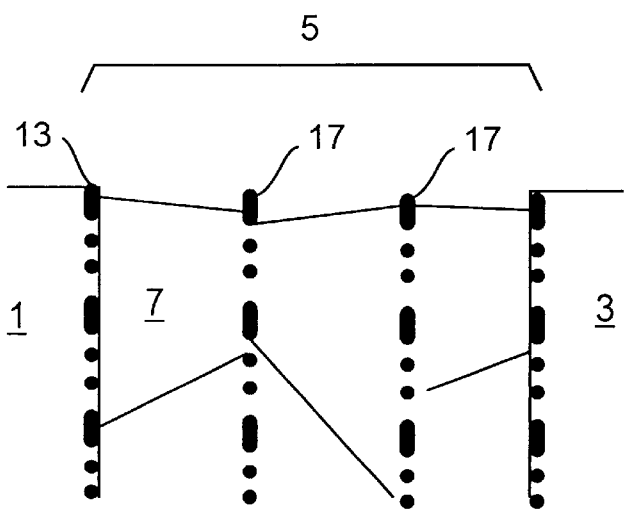
FIG. 5 represents a further embodiment of a semiconductor device according to the present invention that includes a region of monocrystalline semiconductor, a region of polycrystalline semiconductor, and a plurality of interface layers between the region of monocrystalline semiconductor and the region of polycrystalline semiconductor and various portions of the polycrystalline semiconductor.

The interface layers according to the present invention may be discontinuous or continuous as illustrated in FIGS. 3–5. As illustrated in FIG. 5, the layers 17 may be parallel to each other as well as to layers 13.

The embodiments represented in FIGS. 4 and 5 illustrate another aspect of the present invention. This aspect includes suppressing grain growth of polycrystalline material at high temperatures. Providing an interface layer between the grains of polycrystalline material is one approach included in this aspect of the present invention.

Suppressing grain growth of polycrystalline semiconductor material may be accomplished by initially forcing the polycrystalline material into small stable grains by depositing the polycrystalline materials into layers with an interface layer between them as illustrated in FIG. 5. The interface layer may be as described above. The interface layer may limit growth of the grain size to the thickness of the layers of deposited polycrystalline material. Although FIG. 5 illustrates an interface layer between each layer of polycrystalline material, it may only be necessary to include a single interface layer at the boundary between the monocrystalline semiconductor material and the polycrystalline semiconductor material. Such a single layer could stabilize the structure with respect to dislocations, crystal size changes, and dopant redistribution, among other problems.

Depending upon the application and the characteristics that it is desired the interface layer have, the interface layer may include at least one of at least one dielectric material, at least one electrically conducting material, and at least one polycrystalline semiconductor material with a lattice mismatch with respect to the monocrystalline material. More specifically, the interface layer may include at least one oxide, at least one nitride, at least one nitridized oxide, and/or various semiconductor materials. The semiconductor materials may be included in a region having a lattice mismatch with respect to the monocrystalline semiconductor material.

An interface layer including a dielectric material may include both an oxide and a nitride. For example, effectiveness of an oxide containing interface layer may be improved by addition of a nitride. For example, silicon nitride may be included in the interface layer that includes an oxide. This concentration of silicon nitride relative to silicon oxide may vary, depending upon the specific implementation, from zero to one hundred percent. Silicon nitride may be included in the interface because silicon nitride typically is much more stable than oxides and will not dissolve or break up as oxides might, particularly silicon dioxide. Even a fraction, such as one-quarter to one-half, of a monolayer of nitride added to the service of the monocrystalline semiconductor appears to suffice to prevent epitaxial regrowth of polycrystalline semiconductor, in particular, polycrystalline silicon.

The interface layer may also include an electrically conducting material. The electrically conducting material could be amorphous or crystalline. Crystalline material could be monocrystalline or polycrystalline. If the interface layer material is crystalline, it preferably has a lattice constant that is significantly different than the lattice constant of the monocrystalline semiconductor and will not regrow epitaxially. Typical electrical conductors that may utilized include those that are stable at high temperatures and compatible with standard semiconductor processes. If the interface layer includes an electrically conducting material, it could include any of the materials discussed herein.

In the event that the interface layer includes an electrically conductive material, it may be thicker than an interface layer that includes an insulating material. An electrically conductive insulating layer typically is sufficiently conductive to provide a suitable contact resistance between the monocrystalline semiconductor and non-monocrystalline semiconductor.

An electrically conductive interface may also include one or more amorphous materials. Examples of materials that could be utilized as amorphous electrical conductor interface layer include metal oxides and/or metal nitrides. Examples of such materials include SnO, TiN, silicon rich oxides, and oxygen rich silicides.

In the event that the interface layer includes a semiconductor material having a lattice mismatch with respect to the monocrystalline material, the interface layer could include at least one group IV metal, at least one oxide of a group IV metal, at least one silicate of a group IV metal, titanium, titanium nitride, and/or silicon containing alloys. According to one example, the interface layer includes SiGe. Such an interface material may be utilized with a structure that includes a silicon monocrystalline semiconductor region. SiGe could also be utilized in the interface layer where it is desired that the interface layer include at least one dielectric material.

According to one embodiment, the SiGe includes a large Ge contact on silicon. For example, the Ge contact may be greater than about 20%. One example of such a silicon containing alloy is SiGe where the Ge content is sufficiently high to change lattice constant of silicon to a sufficient degree. For example, the Ge concentration in SiGe may be from about 10% to about 30%. If the SiGe is initially deposited as a polycrystalline material, typically it will not recrystallize epitaxially into and/or onto a silicon substrate due to the lattice mismatch. Other materials that may be included in addition to or in place of SiGe include pure Ge, SiGe containing alloys, SiC, or other group IV elements and/or alloys.

The interface layer may provide a tunneling barrier between the non-monocrystalline semiconductor and monocrystalline semiconductor. According to such an embodiment, the interface layer could include at least one nitride. The nitride may be formed on the monocrystalline semiconductor prior to deposition of the non-monocrystalline semiconductor.

The material and/or dimensions, including the parameters discussed below, of the interface layer of the present invention may be selected to providing an interface layer that is sufficiently stable under subsequent processing including elevated temperatures. This may significantly reduce or eliminate the tendency for epitaxial regrowth of the non-monocrystalline semiconductor even if the contacting layer is polycrystalline silicon. This may also eliminate the necessity of utilizing amorphous semiconductor as a contacting layer.

The interface layer may have a variety of physical characteristics, such as thickness, and degree of coverage of the interface between the monocrystalline semiconductor and non-monocrystalline semiconductor, among other characteristics, may vary depending upon the application and desired characteristics. Along these lines, the interface layer may have a variety of structures. For example, the interface layer could be crystalline and/or amorphous.

According to one embodiment, the interface layer includes at least one dielectric material having a thickness of about 0.2 nm to about 2.0 nm. One of ordinary skill in the art could determine appropriate thicknesses and percentage of coverage for a dielectric layer to provide the desired characteristics without undue experimentation once aware of the disclosure contained herein.

According to another embodiment, the interface layer is sufficiently thin such that it will at least partially decompose with subsequent processing to permit electrical contact between the non-monocrystalline semiconductor and the monocrystalline semiconductor. For example, subsequent processing steps including elevated temperatures can cause the interface layer to at least partially decompose, regardless of the composition of the interface layer.

Break up of the interface layer may improve electrical conduction between the monocrystalline semiconductor and non-monocrystalline semiconductor. Preferably, if the interface layer breaks up during subsequent processing and the non-monocrystalline semiconductor includes polycrystalline semiconductor, typically it is desirable that the polycrystalline semiconductor have a large grain size prior to breakup of the interface layer. Large grains can be considered to be greater than about 10 nm. Since grain size may change during processing, this change may need to be taken into account at the time of their formation. Also, grain size may be determined based upon geometry. One of ordinary skill in the art could determine appropriate grain size without undue experimentation once aware of the disclosure contained herein.

An embodiment of the present invention wherein the interface includes an oxide, the oxide layer may be less than about 10 Å. Preferably, the thickness of the interface layer is sufficient to provide sufficient tunneling current through the interface to still provide electrical conduction between the monocrystalline semiconductor and non-monocrystalline semiconductor.

Additionally, a structure according to the present invention may be created according to a variety of different methods. The method utilized as well as the exact parameters utilized in the method may vary depending upon the application. According to one process in which the interface layer includes at least one nitride. The nitride may be formed on the monocrystalline semiconductor prior to deposition of the non-monocrystalline semiconductor. According to one process, the interface layer may be formed by deposition of a nitride and/or other dielectric material. Alternatively, the monocrystalline semiconductor could be treated to form the dielectric material of the interface layer.

Along these lines, if the interface layer includes a nitride, self-limiting nitridation could be carried out on the monocrystalline semiconductor. Self-limiting nitridation could be carried out by ammonia treatment before deposition of the non-monocrystalline, such as polycrystalline or amorphous semiconductor. Such a process could be carried out in a furnace, or rapid thermal processing chamber filled with ammonia.

On the other hand, if interface layer includes a dielectric that includes an oxide, the oxide layer could be produced by treating the monocrystalline semiconductor with oxygen prior to deposition of the non-monocrystalline semiconductor. The oxide could be formed by rapid thermal oxidation. Rapid thermal oxidation could be carried out at temperatures of less than about 700° C. The concentration of $O_2$ gas utilized in the oxidation may be from about 5% to about 100%. Typically, the temperature of this process may be about between 400° C. and about 700° C. More typically, the temperature is from about 500° C. to about 700° C. After formation of the dielectric interface layer, the non-monocrystalline semiconductor may be deposited on the interface layer.

An interface layer including an oxide may also formed at a temperature of between about 500° C. and about 800° C. Such environment may form an oxide layer that is between 2 Å and 28 Å thick.

Oxidizing the monocrystalline semiconductor may be carried out by inserting wafers including monocrystalline semiconductor into a furnace where non-monocrystalline semiconductor is to be deposited. The wafers may be oxidized in the furnace just prior to deposition of the non-monocrystalline semiconductor.

If the interface layer includes a nitride, the nitride can be formed by annealing the monocrystalline semiconductor in an ammonia atmosphere at a temperature of between about 300° C. and 800° C. Higher temperatures may result in excessive nitride thickness such that the nitride is too thick to provide satisfactory conduction. The nitridization can be accomplished even in the presence of a thin oxide layer on a monocrystalline semiconductor that may be formed due to simple atmospheric exposure of the monocrystalline semiconductor.

A nitride containing an interface layer may also be formed by the annealing monocrystalline semiconductor in an $N_2O$ or NO atmosphere. Both $N_2O$ and NO are particularly known to form a nitridized oxide on silicon.

One application that the present invention may be utilized with is as a boundary layer between a buried strap and a monocrystalline substrate that the buried strap is formed adjacent to. Typically, a buried strap may be formed by depositing amorphous silicon on a portion of a monocrystalline silicon substrate. The amorphous silicon may be deposited at temperatures of less than about 575° C. utilizing a silane or disilane gas in conventional LPCVD reactor. Once the amorphous silicon is subjected to temperatures above about 500° C., the amorphous silicon can recrystallize. Temperature may be a function of process pressure. Along these lines, the temperature may be lower in the process pressure is higher. Recrystallization typically proceeds with the generation of some initial nucleation sites within the layer subsequent growth of these nuclei until all available amorphous material is converted into crystalline material.

This process may easily generate average crystal sizes of greater than about 1000 Å. Typically, polycrystalline silicon layers are deposited temperatures of greater than about 600° C. and are polycrystalline as deposited. Such polycrystalline material typically includes a grain structure of small columnar crystallites with diameters of several hundred angstroms. Morphology may be a function of process conditions.

Such processes for creating a buried strap or other polycrystalline semiconductor structure may be carried out so as to initially form as large a grain size in the polycrystalline material as possible. If the polycrystalline layer is first deposited as amorphous layer, in the above application of the buried strap, an interface barrier according to the present invention may be formed prior to deposition of the amorphous silicon. If the present invention interface layer is not present, regardless of the application, upon exposing the amorphous layer to temperatures above about 500° C., crystallization may initiate on the crystalline surface of the monocrystalline substrate. Without an interface layer according to the present invention, a very large epitaxial regrowth region may result. The regrowth region may have a larger size than a regrowth region that results from a treatment of fine grained polycrystalline materials.

Size of grains in polycrystalline material may be limited or stabilized by introducing impurities into the polycrystalline material as it is deposited either as polycrystalline material or as amorphous material. Such impurities could include nitrogen and/or oxygen. Dopants can be introduced as impurities using, for example, in situ doping or a "layer" structure, where dopant are introduced intermittently in the deposition process.

During deposition the amorphous or polycrystalline material simultaneous with impurities, the structure may be exposed to elevated temperatures. Elevated temperatures typically cause the impurities to segregate and be confined to the grain boundaries of polycrystalline material. Once segregated into at least one layer, the impurities preferably will help to control grain growth and help to inhibit further enlargement of grain size.

Alternatively, to forming the polycrystalline material in small grain sizes of less than about 10 nm. On the other hand, the polycrystalline material may be deposited or formed into large grains with dimensions of greater than about 10 nm. Large grains may be more thermodynamically stable than smaller grains and may also be less acceptable to growing larger. As a result, large grains may stabilize the polycrystalline semiconductor structure.

Since grain size may change during processing, this change may need to be taken into account at the time of their formation. Also, grain size may be determined based upon geometry. One of ordinary skill in the art could determine appropriate grain size, whether "large" or "small", without undue experimentation once aware of the disclosure contained herein.

For example, in silicon, large grain polycrystalline silicon may be formed by crystallizing the amorphous deposited silicon at low temperatures. Large grain silicon may be formed by crystallizing amorphous silicon at temperatures as low as possible. For example, the amorphous silicon may be crystallized at a temperature of about 500° C. to about 600° C. at a pressure of about 150 torr to about 600 torr. If the structure includes an interface layer according to the present invention, such as an oxide layer, between monocrystalline semiconductor and the deposited amorphous semiconductor as a result of oxygen treatment of the monocrystalline semiconductor as described above, grain growth of the amorphous semiconductor may be completed at temperatures of about 500° C. to about 600° C. at which the interfacial layer may prevent epitaxial growth at the interface between the monocrystalline semiconductor and amorphous semiconductor at higher temperatures, such as greater than about 900° C., the interfacial layer may tend to breakup as discussed above, permitting the electrical contact between the polycrystalline material being formed from the amorphous semiconductor and the monocrystalline semiconductor.

As stated above, the present invention also includes a semiconductor device that includes a region of monocrystalline semiconductor, a region of non-monocrystalline semiconductor and an interface layer between them. The interface layer may be made of the materials and have the characteristics described above.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for forming a thermally stable ohmic contact structure including a region of monocrystalline semiconductor and a region of polycrystalline semiconductor, the method comprising:

forming at least one region of dielectric material between at least a portion of the region of monocrystalline semiconductor and the region of polycrystalline semiconductor;

controlling a grain growth of the polycrystalline semiconductor; and preventing a boundary shift between the monocrystalline semiconductor and the region of polycrystalline semiconductor during a heat treatment process.

2. The method according to claim 1, further comprising the step of:

forming at least one other region of dielectric material within the region of polycrystalline semiconductor which is parallel to said at least one region of dielectric material between at least a portion of the region of monocrystalline semiconductor and the region of polycrystalline semiconductor.

3. The method according to claim 1, wherein the at least one region of dielectric material has a thickness of about 0.2 nm to about 2.0 nm.

4. The method according to claim 1, wherein the at least one region of dielectric material is deposited on the monocrystalline region.

5. The method according to claim 1, wherein the dielectric material includes at least one nitride.

6. The method according to claim 5, wherein the at least one region of dielectric material is formed through self-limiting nitridation of the monocrystalline region.

7. The method according to claim 5, wherein the at least one region of dielectric material is formed by treating the monocrystalline region with ammonia.

8. The method according to claim 1, wherein the dielectric material includes at least one oxide.

9. The method according to claim 8, wherein the oxide is formed by treating the monocrystalline semiconductor with oxygen.

10. The method according to claim 9, wherein treatment of the monocrystalline semiconductor is carried out at a temperature of less than 700° C.

11. The method according to claim 1, wherein the structure includes a plurality of regions of polycrystalline semiconductor arranged in layers and the method further comprises the steps of:
   forming at least one region of dielectric material adjacent at least a portion of at least one region of polycrystalline semiconductor.

12. The method according to claim 11, wherein the at least one region of dielectric material is formed between at least two regions of polycrystalline semiconductor.

13. The method according to claim 11, including at least two regions of dielectric material formed between at least two regions of polycrystalline semiconductor and between the region of monocrystalline semiconductor and a region of polycrystalline semiconductor.

14. The method according to claim 11, wherein the at least one layer of dielectric material is formed between two portions of the at least one region of polycrystalline semiconductor.

15. The method according to claim 1, wherein the region of polycrystalline semiconductor has a grain size of less than about 10 nm or greater than about 10 mn.

16. The method according to claim 1, wherein the at least one region of dielectric material has a thickness of about 0.2 nm to about 2.0 nm.

17. The method of claim 1, wherein the at least one region of dielectric material is deposited on a sidewall of a trench.

18. A method for forming a thermally stable structure including a region of monocrystalline semiconductor and a region of polycrystalline semiconductor, the method comprising:
   providing at least one region of electrically conducting material between at least a portion of the region of monocrystalline semiconductor and the region of polycrystalline semiconductor; and
   preventing a boundary shift between the region of monocrystalline semiconductor and the region of polycrystalline semiconductor during a heat treatment process.

19. The method according to claim 18, wherein the at least one region of electrically conducting material is amorphous.

20. The method according to claim 18, wherein the at least one region of electrically conducting material is crystalline, has a different lattice constant from the monocrystalline semiconductor material, and will not grow epitaxially.

21. The method according to claim 18, wherein the at least one region of electrically conducting material includes at least one member selected from the group consisting of group IV metals, oxides of group IV metals, suicides of group IV metals, Ti, and TiN.

22. The method according to claim 18, wherein the structure includes a plurality of regions of polycrystalline semiconductor arranged in layers and the method further comprises the steps of:
   forming at least one region of electrically conducing material adjacent at least a portion of at least one of the regions of polycrystalline semiconductor.

23. The method according to claim 22, wherein the at least one region of electrically conducting material is formed between at least two regions of polycrystalline semiconductor.

24. The method according to claim 22, including at least two regions of electrically conducting material formed between at least two regions of polycrystalline semiconductor and between the region of monocrystalline semiconductor and a region of polycrystalline semiconductor.

25. The method according to claim 22, wherein the at least one layer of electrically conducting material is formed between two portions of the at least one region of polycrystalline semiconductor.

26. The method according to claim 18, wherein the region of polycrystalline semiconductor has a grain size of less than about 10 nm or greater than about 10 mn.

27. The method according to claim 18, wherein the at least one region of electrically conducting material is deposited on a sidewall of a trench.

28. The method of claim 18, further comprising depositing at least one other layer of electrically conducting material within the region of polycrystalline semiconductor which is parallel to the at least one layer of electrically conducting material between at least a portion of the region of monocrystalline semiconductor and the region of polycrystalline semiconductor.

29. A method for forming a thermally stable structure including a region of monocrystalline semiconductor and a region of polycrystalline semiconductor subjected to a thermal cycling, the method comprising:
   depositing at least one region of a polycrystalline semiconductor with a lattice mismatch with respect to the monocrystalline semiconductor between at least a portion of the region of monocrystalline semiconductor and the region of polycrystalline semiconductor;
   depositing at least one region of dielectric material on a sidewall of a trench; and
   using the lattice mismatch, suppressing an epitaxial growth within the at least one region of the polycrystalline semiconductor during the thermal cycling.

30. The method according to claim 29, wherein the at least one region of polycrystalline semiconductor with the lattice mismatch is SiGe and the monocrystalline semiconductor is Si.

31. A method for forming a thermally stable structure including a region of monocrystalline semiconductor and a region of polycrystalline semiconductor, the method comprising:
   depositing the region of polycrystalline semiconductor material on a surface of the region of monocrystalline semiconductor;
   introducing at least one impurity into the polycrystalline semiconductor material being deposited in the polycrystalline region during deposition of the polycrystalline semiconductor; and
   preventing a boundary shift between the monocrystalline semiconductor and the region of polycrystalline semiconductor during a heat treatment process.

32. The method according to claim 31, wherein the at least one impurity includes at least one member selected from the group consisting of oxygen and nitrogen.

33. The method according to claim 31, further comprising the step of:
   exposing the monocrystalline semiconductor, polycrystalline semiconductor and at least one impurity to a temperature above about 500° C.

34. The method of claim 31, further comprising depositing at least one region of dielectric material on a sidewall of a trench.

35. A method for forming a thermally stable structure including a region of monocrystalline semiconductor and a region of polycrystalline semiconductor, the method comprising:
   depositing at least one region of amorphous semiconductor material adjacent the region of monocrystalline semiconductor material;
   crystallizing the amorphous semiconductor material; and
   preventing a boundary shift between the amorphous semiconductor material and the region of monocrystalline semiconductor during said crystallizing step.

36. The method according to claim 35, further comprising the step of:
   providing at least one region of an electrically insulating material on the monocrystalline semiconductor region prior to depositing the amorphous semiconductor material.

37. The method according to claim 36, wherein the at least one region of an electrically insulating material is an oxide provided by treating the region of monocrystalline semiconductor with oxygen.

38. The method according to claim 37, wherein crystallization of the amorphous semiconductor is carried out a temperature such that the at least one region of oxide prevents epitaxial growth of the amorphous semiconductor.

39. The method according to claim 37, wherein crystallization of the amorphous semiconductor is carried out a temperature sufficient to cause a break-up of the at least one region of oxide.

40. The method according to claim 37, wherein the oxide is formed with a rapid thermal oxidation.

41. The method according to claim 40, wherein the rapid thermal oxidation comprises the steps of:
   ramping monocrystalline semiconductor material from a temperature of about 25° C. to a temperature in a range of about 500° C. to about 700° C. at a rate in a range of about 5° C./sec to 150° C./sec; and
   holding the temperature in said temperature range for a time in a range of about 1 sec to about 1 min in an atmosphere including O2 at a concentration in a range of about 5% to 100%.

42. The method according to claim 36, wherein the amorphous semiconductor material is deposited on the monocrystalline semiconductor region at a temperature of less than about 575° C.

43. The method according to claim 36, wherein the at least one region of an electrically insulating material includes at least one material selected from the group consisting of an oxide, a nitride, and a nitridized oxide.

44. The method according to claim 43, wherein the electrically insulating material is a nitride and is formed according to a process that includes the steps of:
   annealing at least a portion of a surface of the monocrystalline semiconductor in an ammonia containing atmosphere at a temperature of about 300°0 C. to about 800° C.

45. The method according to claim 43, wherein the electrically insulating material is a nitridized oxide and is formed according to a process that includes the steps of:
   annealing at least a portion of a surface of the monocrystalline semiconductor in an $N_2O$ containing atmosphere at a temperature of about 20° C.

46. The method according to claim 36, wherein the at least one region of an electrically insulating material includes SiGe.

47. The method according to claim 36, wherein the region of electrically insulating material has a thickness of less than about 20 Å.

48. The method according to claim 36, wherein the region of electrically insulating material has a thickness of less than about 10 Å.

49. The method according to claim 35, further comprising the step of:
   providing at least one region of an electrically conducting material on the monocrystalline semiconductor region prior to depositing the amorphous semiconductor material.

50. The method according to claim 49, wherein the electrically conducting material is crystalline and has a different crystal lattice structure as compared to the monocrystalline semiconductor, such that the electrically conducting material will not form an epitaxial layer.

51. The method according to claim 49, wherein the electrically conducting material includes at least one material selected from the group consisting of SiGe, Ge, SiGe alloy, SiC, other group IV elements and alloys containing other group IV elements.

52. The method according to claim 49, wherein the electrically conducting material includes SiGe, wherein the percentage of Ge in the SiGe is about 30% to about 10%.

53. The method according to claim 35, further comprising the step of:
   providing at least one region of an amorphous material on the monocrystalline semiconductor region prior to depositing the amorphous semiconductor material.

54. The method according to claim 53, wherein the amorphous material deposited on the monocrystalline semiconductor includes at least one material selected from the group consisting of a metal oxide and a metal nitride.

55. The method according to claim 53, wherein the amorphous material deposited on the monocrystalline semiconductor includes SnO or TiN.

56. The method according to claim 35, wherein further comprising depositing at least one region of dielectric material on a sidewall of a trench.

57. The method of claim 35, wherein said crystallizing the amorphous semiconductor material is conducted at a temperature of about 500° C. to about 600° C. at a pressure of from about 150 torr to about 600 torr.

* * * * *